(12) United States Patent
Wilhartitz et al.

(10) Patent No.: US 6,908,588 B2
(45) Date of Patent: Jun. 21, 2005

(54) PROCESS FOR MANUFACTURING AN EVAPORATION SOURCE

(75) Inventors: Peter Wilhartitz, Reutte (AT); Stefan Schönauer, Pflach (AT); Peter Polcik, Reutte (AT)

(73) Assignee: Plansee Aktiengesellschaft, Reutte (AT)

( * ) Notice: Subject to any disclaimer, the term of this patent is extended or adjusted under 35 U.S.C. 154(b) by 231 days.

(21) Appl. No.: 10/167,787

(22) Filed: Jun. 12, 2002

(65) Prior Publication Data

US 2002/0155016 A1 Oct. 24, 2002

Related U.S. Application Data

(63) Continuation of application No. PCT/AT01/00349, filed on Nov. 7, 2001.

(30) Foreign Application Priority Data

Nov. 20, 2000 (AT) ...................................... GM851/2000

(51) Int. Cl.$^7$ ................................................ B22F 7/02
(52) U.S. Cl. ................................ 419/6; 419/38; 419/41
(58) Field of Search ............................... 419/6, 38, 41, 419/8

(56) References Cited

U.S. PATENT DOCUMENTS

| | | | | |
|---|---|---|---|---|
| 4,126,451 A | * | 11/1978 | Nayar | 75/208 R |
| 4,752,335 A | * | 6/1988 | Korb | 75/249 |
| 5,342,571 A | * | 8/1994 | Dittmar et al. | 419/13 |
| 5,397,050 A | * | 3/1995 | Mueller | 228/193 |
| 5,656,216 A | * | 8/1997 | Lo et al. | 264/113 |
| 5,836,506 A | * | 11/1998 | Hunt et al. | 228/172 |
| 5,863,398 A | * | 1/1999 | Kardokus et al. | 204/298.13 |
| 5,963,778 A | * | 10/1999 | Stellrecht | 428/554 |
| 6,010,583 A | | 1/2000 | Annavarapu et al. | |
| 6,042,777 A | * | 3/2000 | Lo et al. | 419/8 |
| 6,183,686 B1 | * | 2/2001 | Baradus et al. | 419/8 |
| 6,328,927 B1 | * | 12/2001 | Lo et al. | 419/45 |
| 6,579,431 B1 | * | 6/2003 | Bolcavage et al. | 204/298.13 |

FOREIGN PATENT DOCUMENTS

| | | | |
|---|---|---|---|
| AT | 388752 B | * | 5/1987 |
| JP | 60194070 A | | 10/1985 |
| JP | 63 169 307 A | | 7/1988 |
| JP | 11200030 A | | 7/1999 |
| WO | WO 98/24945 | | 6/1998 |
| WO | WO 00/22185 | * | 4/2000 |

OTHER PUBLICATIONS

Japanese Patent Abstract JP63169307A (Takabayashi), dated Jul. 13, 1988.*
International Search Resport dated Apr. 9, 2002.*

* cited by examiner

*Primary Examiner*—Daniel Jenkins
(74) *Attorney, Agent, or Firm*—Laurence A. Greenberg; Werner H. Stemer; Ralph E. Locher

(57) ABSTRACT

The invention relates to a process for manufacturing an evaporation source for physical vapor deposition. The evaporation source is formed of the actual sputtering target with an aluminum component and one or more further components as well as of a backing plate made from a material having better thermal conductivity than the target. The backing plate made of a powdery starting material is pressed, together with the powdery components of the sputtering target, into sandwiched powder fractions and then formed.

8 Claims, 1 Drawing Sheet

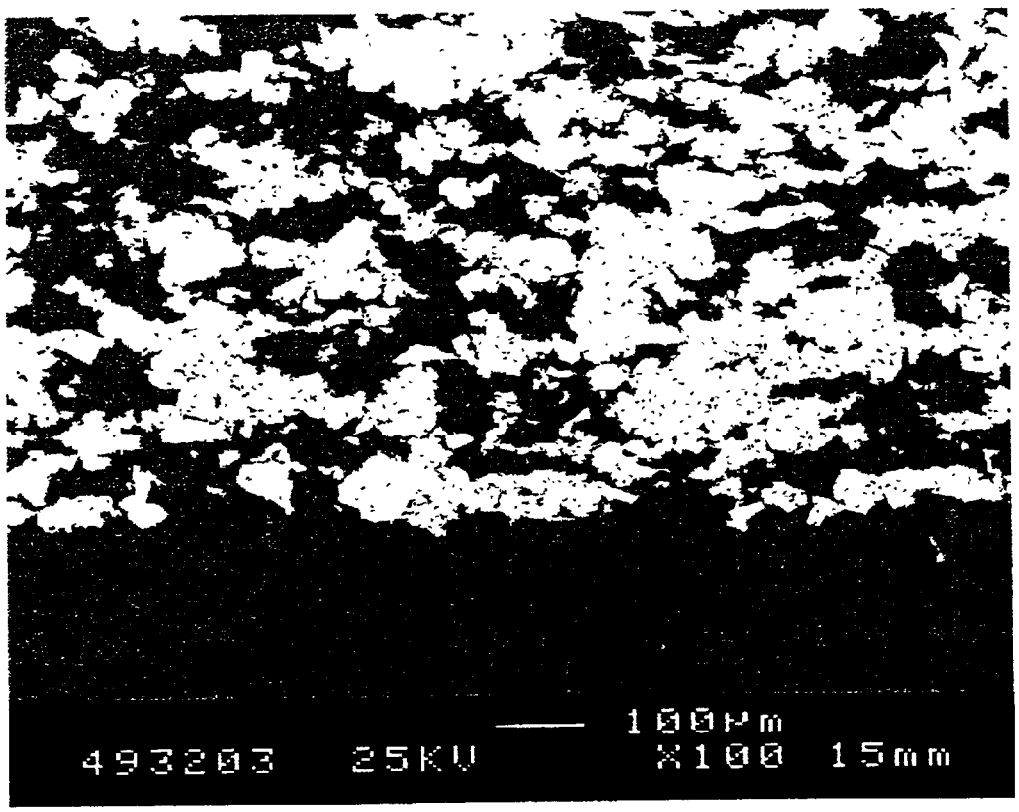

PROCESS FOR MANUFACTURING AN EVAPORATION SOURCE

CROSS-REFERENCE TO RELATED APPLICATION

This is a continuation of co-pending International Application No. PCT/AT01/00349, filed on Nov. 7, 2001, which designated the United States and which was not published in English.

BACKGROUND OF THE INVENTION

FIELD OF THE INVENTION

The invention relates to a process for manufacturing an evaporation source for physical vapor deposition, comprising a target which, in addition to one or more further components, contains an aluminum component and a backing plate, which is connected to the target, made from a material having better thermal conductivity than the target. The target is produced by cold-pressing a mixture of the powdery individual components and subsequently forming it at temperatures below the melting points of the individual components while flowing until a density of at least 98% of the theoretical density is achieved.

Nowadays sputtering targets for physical vapor deposition are used on a large scale for manufacturing various coatings. Their use extends from the production of wear-resistant and corrosion-resistant coatings for a wide range of substrate materials to the production of coated material composites, especially in the semiconductor and electronics industry. This broad spectrum of applications means that a very wide range of coating materials have to be deposited.

It is problematic when different materials have to be deposited at the same time, which would form brittle intermetallic phases during the conventional formation of alloys, so that such alloys can no longer be cold or hot-formed in practice and can only be machined down at considerable expense. Manufacturing sputtering targets from these alloys is therefore very difficult or even impossible.

These problematic materials include, for example, alloys made of aluminum and titanium, which can only be advantageously worked to produce sputtering targets using the above-mentioned process.

The process is described in detail in U.S. Pat. No. 4,752, 335 and Austrian Patent No. 388 752.

Sputtering targets are generally fixed by mechanical means to water-cooled copper plates in the sputtering system in order to reduce the surface temperature. In most cases the sputtering target produced completely from the material to be sputtered is located directly on the copper plate.

Since as much material as possible should be atomized with a sputtering target, the overall height of the sputtering targets thus produced should be as large as possible. However, care should be taken that the thermal resistance of the sputtering targets, which increases as the overall height increases, does not become too large, ensuring that the surface temperature of the sputtering targets can be kept to reliable values.

As the majority of the materials to be atomized can either have relatively good thermal conductivity and/or a relatively high surface temperature without any problems, conventional sputtering systems are set for sputtering targets with relatively large overall heights, with the result that using sputtering targets with smaller overall heights in these systems can be very disadvantageous.

In particular, aluminum, which has excellent thermal conductivity, is very frequently used for coating applications using the sputtering technique, so that many sputtering systems, especially with respect to the overall height of the sputtering targets, are set for the good thermal conductivity of aluminum.

It then becomes a problem in these coating machines when aluminum is to be atomized together with materials that have relatively poor thermal conductivity and that, at the same time, must not have surface temperatures that are too high during the sputtering process, in order to prevent, for example, undesired reactions between several components of the sputtering targets. Thus, aluminum is frequently used together with titanium and, if applicable, additional components for coating applications, particularly in protection against wear and tear.

With sputtering targets made of these materials even small quantities of titanium considerably reduce the aluminum's good thermal conductivity. Consequently, with these sputtering targets, if they are manufactured with the overall heights usually provided for sputtering systems, the resulting surface temperatures at high coating rates can be so high that an exothermic reaction occurs, resulting in the destruction of the target.

However, other materials, which are atomized together with aluminum using sputtering targets, can also be critical and cause problems during the coating process. Material combinations of aluminum with Ta, Nd or Y can be used for electronic applications for example, whereas for optical and magnetic storage media material combinations of aluminum with Ni and Cr are frequently used.

Material combinations of, for example, aluminum with Sn, Zn, Ag, W, Mo, are also frequently used in conjunction with additional Ti portions in applications intended to protect against wear and tear, where one material component acts as a dry-film lubricant.

To ensure that the problems indicated are avoided as much as possible with all these critical material combinations during coating, the deposition rate currently has to be restricted, preventing the surface temperature from rising too high.

One possible way of reducing the surface temperature of such critical sputtering targets even at high coating rates without altering the overall height is by providing the part of the sputtering targets in the area of the contact zone with the water-cooled copper plate with a backing plate made of a good heat-conductive material and then mechanically connecting this backing plate to the copper plate.

Processes for manufacturing such evaporation sources, where the backing plate is connected to the sputtering target by soldering or diffusion bonding are described, for example, in international PCT publication WO 00/22185 and in U.S. Pat. No. 5,397,050.

It is disadvantageous with evaporation sources manufactured in this way that a transition zone of poor thermal conductivity can occur between the target and backing plate, which does not guarantee optimum heat dissipation from the surface of the sputtering targets into the backing plate and then on into the cooled copper plate.

Due to the fact that a temperature on the surface of the sputtering target that is just a few degrees higher results in disadvantages with respect to the atomization properties, such transition zones with poor thermal conductivity should be avoided if possible.

SUMMARY OF THE INVENTION

It is accordingly an object of the invention to provide a process for manufacturing an evaporation source for physical vapor deposition, which overcomes the above-mentioned disadvantages of the heretofore-known devices and methods of this general type and in which the sputtering target containing aluminum components is connected to the backing plate without forming a transition zone of poor thermal conductivity.

With the foregoing and other objects in view there is provided, in accordance with the invention, a method of manufacturing an evaporation source for physical vapor deposition, the evaporation source having a target with a given thermal conductivity, and a backing plate connected to the target and consisting of a material having a better thermal conductivity than the target, the method which comprises:

producing the target by cold-pressing a mixture of target components, including an aluminum component and at least one additional component, in powdery form and subsequently forming the target at temperatures below melting points of the individual components while flowing until a density of at least 98% of a theoretical density is achieved; and pressing the backing plate, from a powdery starting material, together with the target components, into layered powder fractions and subsequently forming the backing plate together with the target.

In other words, the object of the invention is achieved by pressing the backing plate, which also comprises a powdery starting material, together with the target components, into layered powder fractions and then forming the pressed die.

In this way an excellent connection can be produced between the target material and backing plate without the formation of a transition zone with poor thermal conductivity, so that excellent heat dissipation from the surface of the sputtering target into the backing plate and then into the water-cooled copper plate is achieved.

As the sputtering targets are generally bolted or clamped to the water-cooled plate it is a good idea to design the section of the target, which can thus no longer be atomized anyway, as the backing plate, so that with the same overall height as much material, which can be evaporated effectively, is available compared to sputtering targets without a backing plate.

In order to achieve a particularly good connection of the target material with the backing plate, the target should advantageously consist of at least 15 atom % aluminum.

Sputtering targets where the invention can be realized in a particularly advantageous manner are targets made of 15 atom % aluminum and 85 atom % titanium.

Pure aluminum, which has excellent thermal conductivity, is suitable as a particularly advantageous material for the backing plate of the evaporation source. As aluminum is relatively soft, a good transition zone with low thermal resistance can be achieved thanks to the mechanical connection with the water-cooled copper plate. In addition, the damage to the deposited coating is not too great, if the target material should inadvertently be oversputtered and, as a result, a certain portion of the backing plate is sputtered as well.

However, as well as aluminum, other materials with good thermal conductivity, such as, for example, copper are also suitable for the backing plate.

A proven method for achieving flow of the material during the forming of the pressed forging is the use of the forging process in forging presses.

If the target is constructed from aluminum/titanium, for example 15 atom % aluminum and 85 atom % titanium, carrying out the forging process at a temperature of between 400° C. and 450° C. has proven worthwhile.

Extrusion is another method of forming the pressed forging while the material is flowing as advantageously as possible.

The advantage of this variant of the manufacturing process according to the invention is that sputtering targets with varying overall heights can be separated from the extrusion billet.

Other features which are considered as characteristic for the invention are set forth in the appended claims.

Although the invention is illustrated and described herein as embodied in process for manufacturing an evaporation source, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the following examples.

BRIEF DESCRIPTION OF THE DRAWINGS

The sole FIGURE of the drawing is a 100× micrograph produced with an electron microscope of a transition zone resulting from the process of the following example 1.

DESCRIPTION OF THE PREFERRED EMBODIMENTS

EXAMPLE 1

A disc-shaped evaporation source with a 63 mm diameter and a total height of 32 mm, comprising a 20 mm high sputtering target made of 50 atom % aluminum and 50 atom % titanium and a 12 mm high aluminum backing plate, which is firmly fixed to the sputtering target, was manufactured as follows in accordance with the process according to the invention.

The aluminum powder and titanium powder for the sputtering target with an average grain size of 30 μm were mixed in an asymmetric moved mixer.

In a two-piece die of a hydraulic press, which was sufficiently oversized with respect to the final dimensions of the evaporation source, the bottom of the die was first filled with pure aluminum powder with an average grain size of 30 μm and the powder filling flattened. Then the top of the die was put in position and filled with the mixed aluminum/titanium powder, the powder mixture was again flattened and the die filling was cold-pressed to form a green compact with 94% of its theoretical density.

The pressed forging underwent secondary compression in a forging press with a half-open forging die with a forging temperature of approximately 200° C. in a total of five passes with the individual components flowing or being kneaded.

In addition, the pressed forging was placed in a preheating furnace at a temperature of between 400° C. and 450° C. prior to the secondary compression and between the individual compression stages. No oxidation protection was required due to the short forming times and low forming temperatures, so that the secondary compression could take place in an unknown condition.

Finally, the evaporation source was mechanically processed to produce the final dimensions.

A metallograph was taken of the transition zone between the material of the sputtering target and the material of the backing plate. The FIGURE shows the transition zone with a magnification of 100×.

The absolutely homogeneous transition between the material of the sputtering target and the material of the backing plate without the formation of a troublesome intermediate layer with reduced thermal conductivity can be clearly seen.

EXAMPLE 2

For comparison purposes a disc-shaped evaporation source with the same dimensions as in Example 1 was produced. In contrast to Example 1 the evaporation source completely comprises a sputtering target made of 50 atom % aluminum and 50 atom % titanium and does not contain an aluminum backing plate. The sputtering target was manufactured with the same production parameters as in Example 1.

EXAMPLE 3

For comparison purposes an evaporation source comprising a sputtering target and a backing plate with the same dimensions and same material combinations as in Example 1 was produced. Unlike Example 1 the evaporation source was not manufactured by simultaneous processing of the powdery starting materials. Rather, the backing plate was rough-worked in the same dimensions irrespective of the sputtering target from a copper semifinished product made by melting metallurgy and was then connected using an indium intermediate layer by bonding to the finished sputtering target, which was made by means of powder metallurgy and which was manufactured with the same production parameters as in Example 1.

The evaporation sources corresponding to Examples 1 and 3 were installed one after another in an ARC evaporation plant and atomized under the same coating conditions, which are usually used, with an ARC current intensity of 60 A corresponding to a flow of 0.7 MW/m$^2$ and the surface temperatures of the individual sputtering targets were thus determined.

The following surface temperatures were produced following an atomization time of approximately 2 minutes:

The evaporation source manufactured according to the invention in accordance with Example 1 had a surface temperature of 315° C.

The sputtering target manufactured in accordance with Example 2 without a backing plate had a highest surface temperature of 420° C.

The evaporation source manufactured in accordance with Example 3 with a bonded backing plate had a surface temperature of 395° C.

The clearly higher surface temperature compared to Example 1 despite the fact that a backing plate with the same dimensions was used clearly shows the extremely disadvantageous effect of the indium intermediate layer with reduced thermal conductivity required for the bonding.

Due to the fact that even a surface temperature of the sputtering target, which is a few degrees lower, brings with it advantages as regards the atomization characteristics, the enormous benefit of the evaporation source according to the invention compared with previous evaporation sources according to the prior art is proven.

We claim:

1. A method of manufacturing an evaporation source for physical vapor deposition, the evaporation source having a target with a given thermal conductivity, and a backing plate connected to the target and consisting of a material having a better thermal conductivity than the target, the method which comprises:

providing a target material in powdery form, the target material having an aluminum component with a given melting point and at least one additional component with a given melting point;

providing a backing plate material in powdery form;

layering the target material in powdery form and the backing plate material each in powdery form into layered powder fractions; and commonly cold-pressing the target material and the backing plate material from the layered powder fractions and subsequent deforming at temperatures below the melting points of the individual components of the materials while flowing until a density of at least 98% of a theoretical density is achieved, to thereby form a compact of the evaporation source having a target and a backing plate connected to the target.

2. The method according to claim 1, which comprises producing the target with at least 15 atom % aluminum.

3. The method according to claim 2, which comprises producing the target with 85 atom % titanium as a second component.

4. The method according to claim 3, which comprises deforming the target with the backing plate by forging in a forging press at a temperature of between 400° C. and 450° C.

5. The method according to claim 3, which comprises deforming the target with the backing plate by extrusion at a temperature of between 400° C. and 450° C.

6. The method according to claim 1, which comprises producing the backing plate from aluminum.

7. The method according to claim 1, which comprises deforming the target with the backing plate by forging the compact in a forging press.

8. The method according to claim 1, which comprises deforming the target with the backing plate by extrusion.

* * * * *